(12) United States Patent
Milo et al.

(10) Patent No.: US 12,136,587 B2
(45) Date of Patent: Nov. 5, 2024

(54) LEAD FRAME FOR A DIE

(71) Applicant: TEXAS INSTRUMENTS INCORPORATED, Dallas, TX (US)

(72) Inventors: Dolores Babaran Milo, Baguio (PH); Cherry Lyn Marquez Aranas, Pampanga (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/051,152

(22) Filed: Jul. 31, 2018

(65) Prior Publication Data
US 2020/0043833 A1 Feb. 6, 2020

(51) Int. Cl.
*H01L 23/495* (2006.01)
*H01L 21/56* (2006.01)
*H01L 23/00* (2006.01)

(52) U.S. Cl.
CPC .. *H01L 23/49503* (2013.01); *H01L 23/49579* (2013.01); *H01L 24/48* (2013.01); *H01L 21/565* (2013.01); *H01L 2924/10253* (2013.01)

(58) Field of Classification Search
CPC ............... H01L 24/48; H01L 23/49513; H01L 23/49579; H01L 23/49861; H01L 23/49503; H01L 21/4828; H01L 21/565; H01L 2924/10253
See application file for complete search history.

(56) References Cited

U.S. PATENT DOCUMENTS

| | | | | |
|---|---|---|---|---|
| 8,460,970 | B1 * | 6/2013 | Sirinorakul | H01L 23/49582 |
| | | | | 438/123 |
| 2002/0084518 | A1 * | 7/2002 | Hasebe | H01L 24/97 |
| | | | | 257/676 |
| 2005/0133878 | A1 | 6/2005 | Huang | |
| 2007/0075404 | A1 * | 4/2007 | Dimaano, Jr. | H01L 23/3107 |
| | | | | 257/E23.037 |
| 2012/0007225 | A1 * | 1/2012 | Hasebe | H01L 21/563 |
| | | | | 257/676 |
| 2012/0186857 | A1 * | 7/2012 | Inoue | H05K 3/3485 |
| | | | | 228/199 |
| 2012/0205790 | A1 * | 8/2012 | Haga | H01L 21/4842 |
| | | | | 257/676 |
| 2016/0071743 | A1 | 3/2016 | How et al. | |
| 2016/0336296 | A1 * | 11/2016 | Jeong | H01L 23/49827 |
| 2017/0148697 | A1 | 8/2017 | Kamphuis et al. | |

FOREIGN PATENT DOCUMENTS

| CN | 107017216 A | 8/2017 |
|---|---|---|
| KR | 20140046612 A | 4/2014 |

* cited by examiner

*Primary Examiner* — Vongsavanh Sengdara
(74) *Attorney, Agent, or Firm* — Ronald O. Neerings; Frank D. Cimino

(57) ABSTRACT

A semiconductor device includes a silicon die having a metal material coating applied on one side, a lead frame having a mounting pad having an area smaller than an area of the silicon die, the silicon die being mounted on the lead frame via the mounting pad, and an etched area filled with a non-conductive mold compound on a side of the lead frame that comes into contact with an end of the silicon die along an edge of the silicon die. A volume of epoxy material is dispensed onto the lead frame along a length of the metal material coating to form a fillet weld on a side of the silicon die configured to adhere the silicon die to the lead frame and to prevent the metal material coating from coming into contact with the lead frame.

38 Claims, 4 Drawing Sheets

LEAD FRAME FOR A DIE

TECHNICAL FIELD

This relates to semiconductor devices, or more particularly to a lead frame for a die.

BACKGROUND

In semiconductor packaging, the lead frame is a structure inside the chip package that carries signals from a die to the outside. The die inside the package is typically glued to the lead frame, and then bond wires attach die pads to the leads. Lead frames are manufactured by removing material. Two processes used for this are etching and stamping. The quality of the lead frame is a factor impacting the performance and reliability of the packaged integrated circuit.

During manufacturing of a lead frame, a metal burr is induced during wafer dicing with a saw due to the softness of a metal material coating. Prior methods to prevent the burr from coming into contact with the lead frame include increasing a gap between the lead frame through the addition of new material in between the metal material and the lead frame, use of a grid array quad flat no-lead (GQFN) package, and lead frame isolation through a half etch canal. However, these methods require additional processes and/or additional material, and are unreliable.

SUMMARY

This disclosure relates to an apparatus and method to implement lead frame isolation thru etched pre-molding. Disclosed is a lead frame apparatus and method of manufacturing a lead frame apparatus. The lead frame includes an etched area filled with a non-conductive mold compound. The lead frame is designed such that a metal burr that protrudes from a metal material coating existing on the backside of a silicon die rests on the etched area filled with mold rather than the lead frame itself. The etched area provides electrical isolation between the silicon die and the lead frame. More specifically, electrical leakage and shorting is prevented because the metal burr comes in contact with the etched area filled with a mold compound rather than the lead frame. The lead frame is further designed such that a mounting pad of the lead frame has an area smaller than an area of a silicon die that is mounted on the lead frame. The lead frame design is implemented for semiconductor product packaging.

In one example, a semiconductor device implementing lead frame isolation thru etched pre-molding is disclosed. A semiconductor device implementing lead frame isolation thru etched pre-molding is disclosed. The semiconductor device includes a silicon die having a metal material coating applied on one side, a lead frame having a mounting pad having an area smaller than an area of the silicon die, the silicon die being mounted on the lead frame via the mounting pad, and an etched area filled with a non-conductive mold compound on a side of the lead frame that comes into contact with an end of the silicon die along an edge of the silicon die. A volume of epoxy material is dispensed onto the lead frame along a length of the metal material coating to form a fillet weld on a side of the silicon die configured to adhere the silicon die to the lead frame and to prevent the metal material coating from coming into contact with the lead frame.

In another example, a method of fabricating a semiconductor device implementing lead frame isolation thru etched pre-molding is disclosed. The method includes etching an area within a lead frame such that a mounting pad of the lead frame has an area smaller than an area of a silicon die that has a metal material coating. The method further includes filling the etched area with a non-conductive mold compound. The method further includes dispensing a volume of epoxy material on the lead frame along a length of the metal material coating to form a fillet weld on a side of the silicon die to adhere the silicon die to the lead frame and to prevent the metal material coating from coming into contact with the lead frame. The method further includes mounting the silicon die onto the mounting pad of the lead frame via the metal material coating and the epoxy material, wherein an edge of the silicon die comes into contact with the non-conductive mold compound.

In yet another example, a semiconductor device implementing lead frame isolation thru etched pre-molding is disclosed. The semiconductor device includes a silicon die having a metal material coating applied on one side. The semiconductor device further includes a lead frame having a mounting pad having an area smaller than an area of the silicon die, the silicon die being mounted on the lead frame via the mounting pad, and an etched area filled with a non-conductive mold compound on a side of the lead frame that comes into contact with an end of the silicon die along an edge of the silicon die.

DETAILED DESCRIPTION

The lead frame design disclosed herein will be described in view of the figures illustrated in the corresponding drawings. As will be shown by the figures, the design of the lead frame is such that the metal burr comes into contact with an etched area filled with a non-conductive mold compound. As the metal burr comes into contact with the non-conductive mold compound rather than the lead frame, electrical leakage and shorting is prevented.

Figure 1:
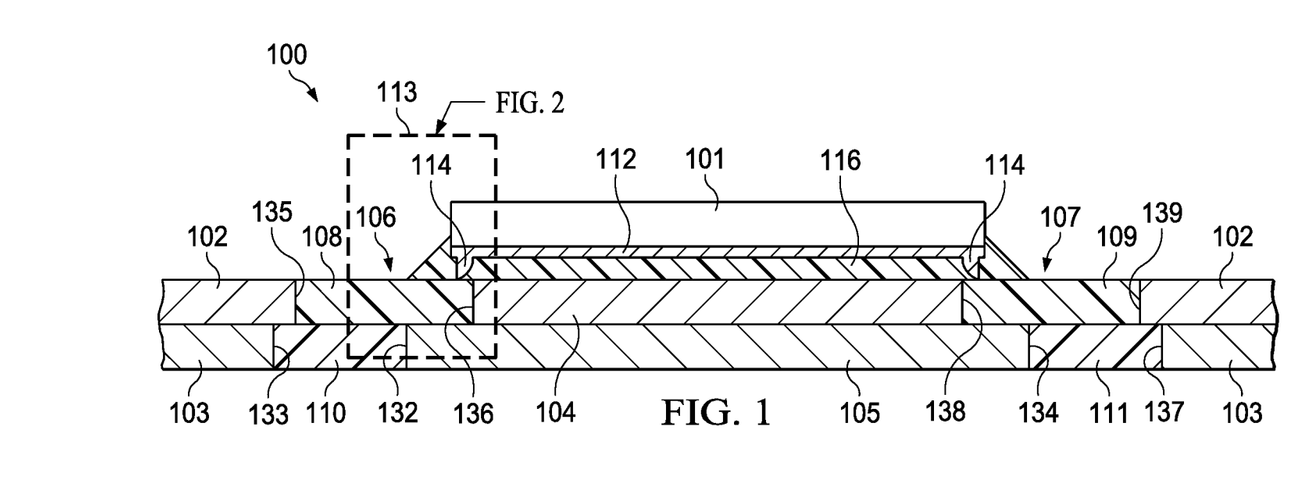
FIG. 1 is an example block diagram of a semiconductor device that implements lead frame isolation thru etched pre-molding.

FIG. 1 is a block diagram of a semiconductor device 100 that implements lead frame isolation thru etched pre-molding. As shown in FIG. 1, the semiconductor device 100 includes a silicon die 101 having a metal material coating 112 on one side. A volume of epoxy material 116 is dispensed onto the lead frame 102 along the length of the metal material coating 112 for adhesion of the silicon die 101 onto a lead frame 102 to form a fillet weld on a side of the silicon die 101. In addition to providing adhesion of the silicon die 101 to the lead frame 102, the epoxy material 116 prevents the metal material coating 112 from coming into contact with the lead frame 102. The lead frame 102 includes a mounting pad 104 such that the silicon die 101 is mounted onto the lead frame 102 via the mounting pad 104. The mounting pad 104 has an area smaller than the area of the silicon die 101. The lead frame 102 includes a first etched area 106 filled with a non-conductive mold compound on one side of the lead frame 102 that comes into contact with one end of the silicon die 101 along an edge of the silicon die 101. The lead frame 102 further includes a second etched area 107 filled with the non-conductive mold compound located on a side opposite the first etched area 106 that comes into contact with another end of the silicon die 101 along an edge of the silicon die 101. The first etched area 106 and the second etched area 107 provide electrical isolation between the silicon die 101 and the lead frame 102. In the example shown in FIG. 1, the first etched area 106 has two regions that span the thickness of the lead frame 102, namely a first region 108 of the first etched area 106 and a second region 110 of the first etched area 106. As will be described in more detail below, the first etched area 106 is designed to have a first region 108 as well as a second region 110. In one example only the first region 108 is filled with a non-conductive mold compound and the second region 110 is empty (e.g., to save material). In another example, the first region 108 is filled with a different type of non-conductive mold compound material than the second region 110 (e.g., one material may be less expensive but it is desired that both regions are filled with a non-conductive mold compound). If the first region 108 and second region 110 comprise the same material, then there is a continuous material deposited in the first region 108 and the second region 110. If the second region 110408 is void, or if the first region 108 and the second region 110 comprise different material, then a barrier between the first region 108 and the second region 110 represents a transition between the composition of the first region 108 and the composition of the second region 110. Also, the second etched area 107 has two regions that span the thickness of the lead frame, namely a first region 109 of the second etched area 107 and a second region 111 of the second etched area 107.

Further, as will be described in more detail below, the second etched area 107 is designed to have a first region 109 as well as a second region 111. In one example, only the first region 109 is filled with a non-conductive mold compound and the second region 111 is empty (e.g., to save material). In another example, the first region 109 is filled with a different type of non-conductive mold compound material than the second region 111 (e.g., one material may be cheaper but it is desired that both regions are filled with a non-conductive mold compound). If the first region 109 and second region 111 comprise the same material, then there is a continuous material deposited in the first region 109 and the second region 111. If the second region 109 is void, or if the first region 109 and the second region 111 comprise different material, then a barrier between the first region 109 and the second region 111 represents a transition between the composition of the first region 109 and the composition of the second region 111.

As can be seen in FIG. 1, a metal burr 114 protrudes from the metal material coating 112 on both sides of the metal material coating 112. Because the length of the mounting pad 104 is smaller than the length of the silicon die 101, the metal burr 114 will come into contact with and rests on the first etched area 106 and the second etched area 107 rather than the lead frame 102 itself, or more specifically, rather than the mounting pad 104 of the lead frame 102. The first etched area 106 and the second etched area 107 provide electrical isolation between the silicon die 101 and the lead frame 102. Electrical leakage and shorting is prevented because the metal burr 114 comes in contact with the first region 108 of the first etched area 106 filled with non-conductive mold compound and the first region 109 of the second etched area 107 filled with non-conductive mold compound rather than the lead frame 102 or the mounting pad 104 of the lead frame 102. An inset area 113 shows where the metal burr 114 contacts the first etched area 106 rather than the mounting pad 104 of the lead frame 102.

The first etched area 106 of the lead frame 102 and the second etched area 107 of the lead frame 102 has a thickness similar to that of the lead frame 102. In some examples, the entire depth/thickness of the first etched area 106 and/or the second etched area 107 is filled with the mold compound. For example, and in particular the example shown in FIG. 1, the first region 108 of the first etched area 106 is filled with a mold compound, and the second region 110 of the first etched area 106 is also filled with a mold compound; and the first region 109 of the second etched area 107 is filled with a mold compound, and the second region 111 of the second etched area 107 is also filled with a mold compound. In other examples, a portion (e.g., one-half) of the first etched area 106 and/or the second etched area 107 is filled with a mold compound. In such examples, the first region 108 of the first etched area 106 is filled with a mold compound, while the second region 110 of the first etched area 106 is not filled with a mold compound; and the first region 109 of the second etched area 107 is filled with a mold compound, while the second region 111 of the second etched area 107 is not filled with a mold compound. The mounting pad 104 extends across a support structure 105 of the lead frame 102. The support structure 105 corresponds to and has a similar thickness of the second region 110 of the first etched area 106 and the second region 111 of the second etched area 107. The area of the support structure 105 depends on the thermal pad dimensions required or provided by the customer or user of the lead frame 102. In the example shown in FIG. 1, the support structure 105 of the lead frame 102 has an area greater than the mounting pad 104. Accordingly, in the example shown in FIG. 1, the edges 132, 134 of the support structure 105 extend beyond the edges 136, 138 of the mounting pad 104 to provide stability when the silicon die 101 is mounted. In other examples, the support structure 105 of the lead frame 102 does not have an area greater than the mounting pad 104. In examples where the support structure 105 of the lead frame 102 does not have an area greater than the mounting pad 104, the edges 132, 134 of the support structure 105 are flush with, or are substantially flush with, the edges 136, 138 of the mounting pad 104; or, the support structure 105 of the lead frame 102 has a smaller area than the mounting pad 104 of the lead frame 102 such that the edges 132, 134 of the support structure are underneath the mounting pad 104. Similar variations in lengths and positions are possible with respect to edges 133 and 135, and edges 137 and 139. In some examples, the support structure 105 is part of the same original structure as the mounting pad 104, in which case, the support structure 105 and the mounting pad 104 are made of the same material with the mounting pad 104 being etched more than the support structure 105 to give the lead frame 104 a stepped appearance as is shown in FIG. 1. While in other examples, the support structure 105 and the mounting pad 104 are made of different materials, or are made of the same material but are separate pieces, in which case the support structure 105 and mounting pad 104 are attached through an electrical or mechanical process, for example via epoxy weld, riveting, soldering or similar means.

Inclusion of the first etched area 106 and the second etched area 107 of the lead frame 102 filled with non-conducive mold compound obviates the need to implement an additional process with increased time to fabricate additional costly material (such as conductive epoxy, conductive die attach film, and/or a silicon spacer) to increase the gap between the epoxy material 116 and the lead frame 102. Also, the etched out molded areas of the lead frame (including first etched area 106 and second etched area 107) obviates the need for use of a grid array flat no-lead (GQFN) package, or implementation of an unreliable half etch gap with no inserted molded material in the lead frame 102. The overall thermal conductivity of the semiconductor device 100 is not compromised, because merely a portion of an area of the lead frame 102 on which the silicon die 101 is mounted is an etched gap filled with mold compound to electrically isolate the metal burr 114.

Adhering the silicon die 101 to the lead frame 102 design disclosed herein does not require additional processing actions relative to a lead frame where the first etched area 106 and the second etched area 107 are omitted. In particular, in some examples, the lead frame 102 is provided to an IC packager with the first etched area 106 and the second etched area 107 filled with the mold compound. Accordingly, the silicon die 101 is mountable on the lead frame 102 without additional processing. IC chips packaged with the lead frame 102 results in higher yield because the risk of shorting and leakage is mitigated. The lead frame 102 design also involves a faster production cycle time without altering the composition of the silicon die 101 and/or the process of dicing the silicon die 101 from a wafer.

Figure 2:
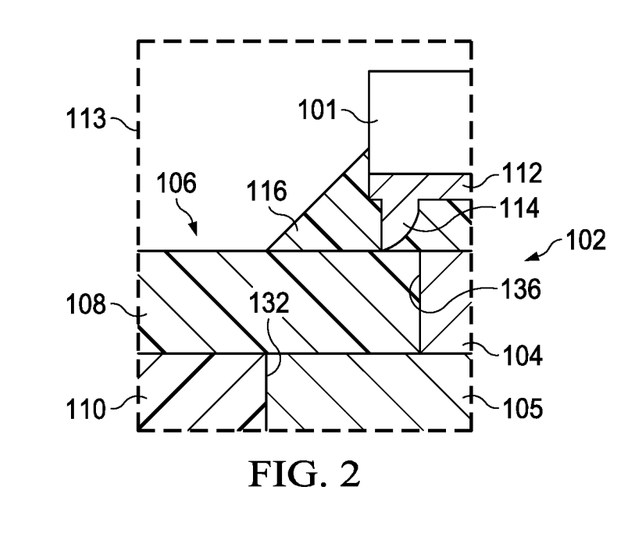
FIG. 2 depicts a close up view the inset area of the etched semiconductor device of FIG. 1.

FIG. 2 shows a close up view of the inset area 113 of FIG. 1. For purposes of simplification of explanation, the same reference numbers are employed in FIGS. 1 and 2 to denote the same structure. Inset area 113 of the semiconductor device shows that the metal burr 114 protrudes out of one end of the metal material coating 112 to come into contact with the first etched area 106 filled with mold compound rather than the mounting pad 104 of the lead frame 102. A volume of epoxy material 116 is dispensed onto the lead frame 102 for adhesion of the silicon die 101 and the lead frame 102 to form a fillet weld on a side of the silicon die 101. The epoxy material 116 also provides electrical isolation between the silicon die 101 and the lead frame 102. In some examples, the second region 110 of the first etched area 106 is filled with a mold compound made of the same material that fills the first region 108 of the first etched area 106. In other examples, to save material, the second region 110 of the first etched area 106 is empty/hollow (e.g., a void). The design of the lead frame 102 provides electrical isolation between the mounted silicon die 101 and the lead frame 102. The support structure 105 of the lead frame 102 corresponds to and has a similar thickness as the second region 110 of the first etched area 106. As discussed above with respect to FIG. 1, the area of the support structure 105 depends on the thermal pad dimensions required or provided by the customer or user of the lead frame 102. In the example shown in FIG. 2, the support structure 105 of the lead frame 102 has an area greater than the mounting pad 104. Accordingly, in the example shown in FIG. 2, the edge 132 of the support structure 105 extends beyond the edge 136 of the mounting pad 104 to provide stability when the silicon die 101 is mounted. In other examples, the support structure 105 of the lead frame 102 does not have an area greater than the mounting pad 104. In examples where the support structure 105 of the lead frame 102 does not have an area greater than the mounting pad 104, the edge 132 of the support structure 105 is flush with, or is substantially flush with, the edge 136 of the mounting pad 104; or, the support structure 105 of the lead frame 102 has a smaller area than the mounting pad 104 of the lead frame 102 such that the edge 132 of the support structure is underneath the mounting pad 104.

Figure 3:
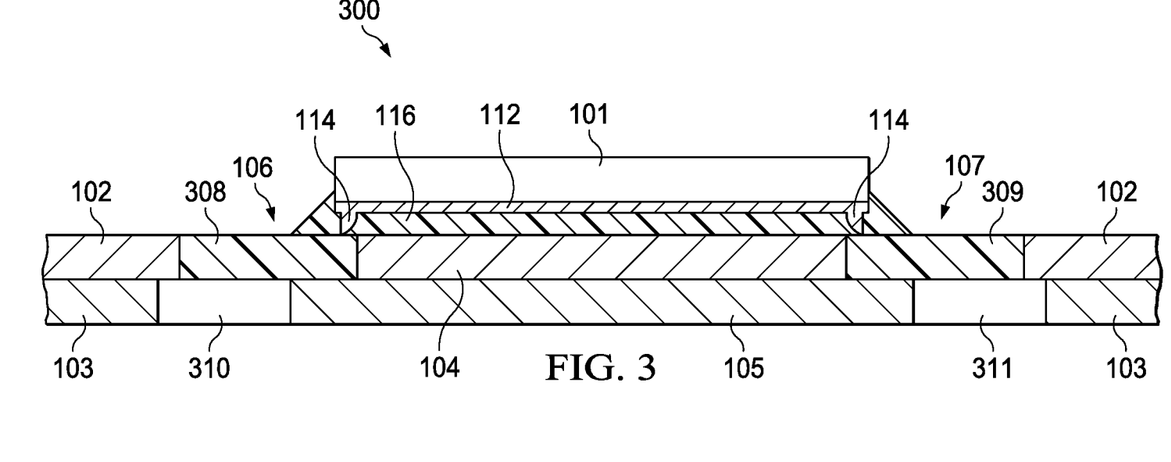
FIG. 3 is a block diagram of a semiconductor device that implements lead frame isolation thru half etched pre-molding.

FIG. 3 is a block diagram of a semiconductor device 300 that implements lead frame isolation thru half etched pre-molding. For purposes of simplification of explanation, the same reference numbers are employed in FIGS. 1 and 3 to denote the same structure (with the exception of the first and second regions of the first and second etched areas). In the example shown in FIG. 3, the second region 310 of the first etched area 106 is empty/hollow (e.g., a void), while the first region 308 of the first etched area 106 is filled with a non-conductive mold compound. Additionally, in FIG. 3, the second region 311 of the second etched area 107 is empty/hollow (e.g., a void), while the first region 309 of the second etched area 107 is filled with the non-conductive mold compound. By contrast, in FIG. 1, second region 310 of the first etched area 106 is filled with the non-conductive mold compound, as is the second region 311 of the second etched area 107. Other permutations besides those depicted in FIG. 1 and FIG. 3 are also possible, as well. In some examples, the second region 310 of the first etched area 106 is filled with the mold compound while the second region 311 of the second etched area 107 is not filled with the mold compound, or vice versa; or, in some examples, different respective materials are used to fill the first region 308 of the first etched area 106, the second region 310 of the first etched area 106, the first region 309 of the second etched area 107, and the second region 311 of the second etched area 107, respectively. Types of mold compound material include, for example, mold compounds of different generations. Specific types of mold compound material includes first generation low-stress, second generation low stress, third generation ultra low-stress, moisture resistant, and anti-crack.

Figure 4:
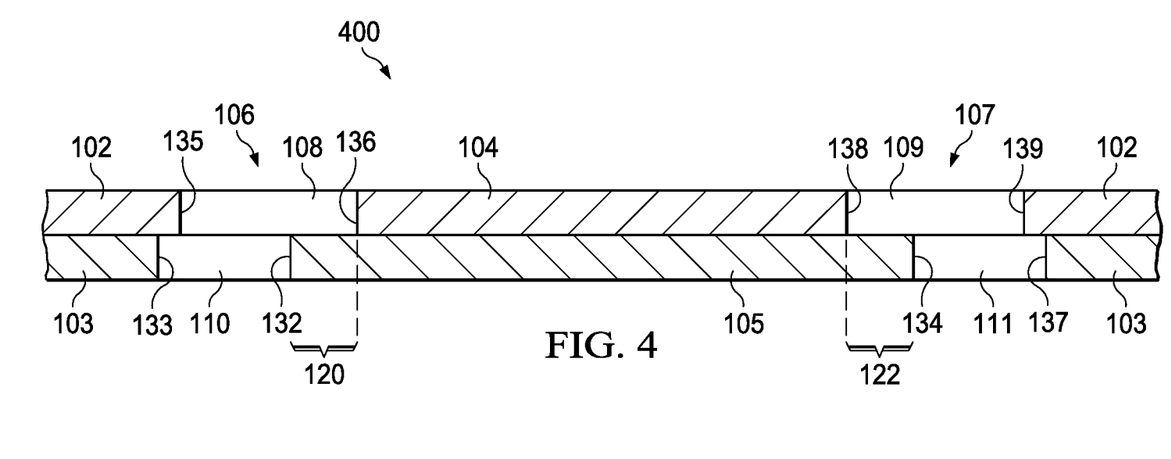
FIG. 4 depicts an example first phase of manufacturing an etched semiconductor device that provides lead frame isolation.
Figure 5:
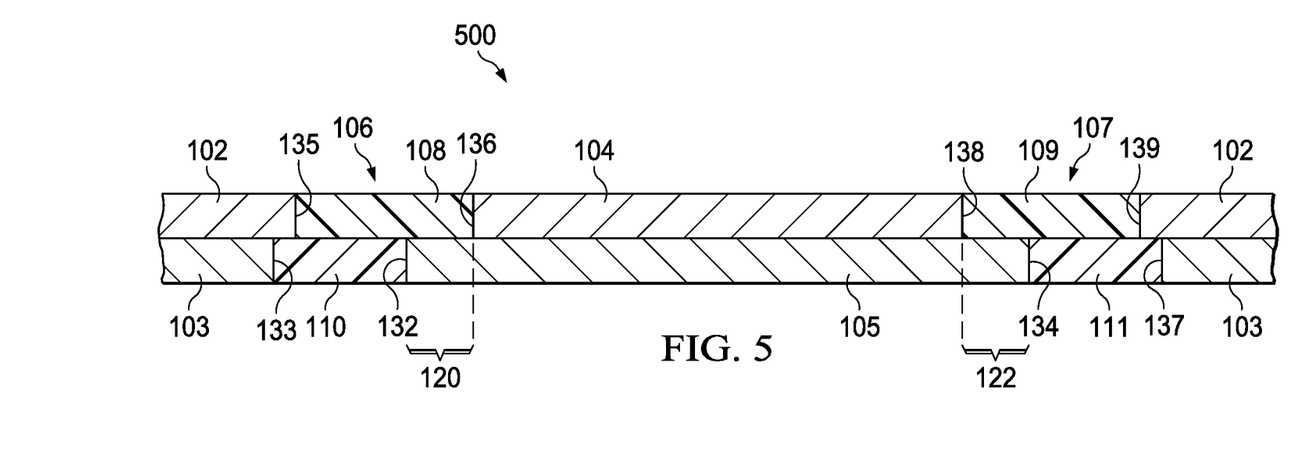
FIG. 5 depicts an example second phase of manufacturing an etched semiconductor device that provides lead frame isolation.
Figure 6:
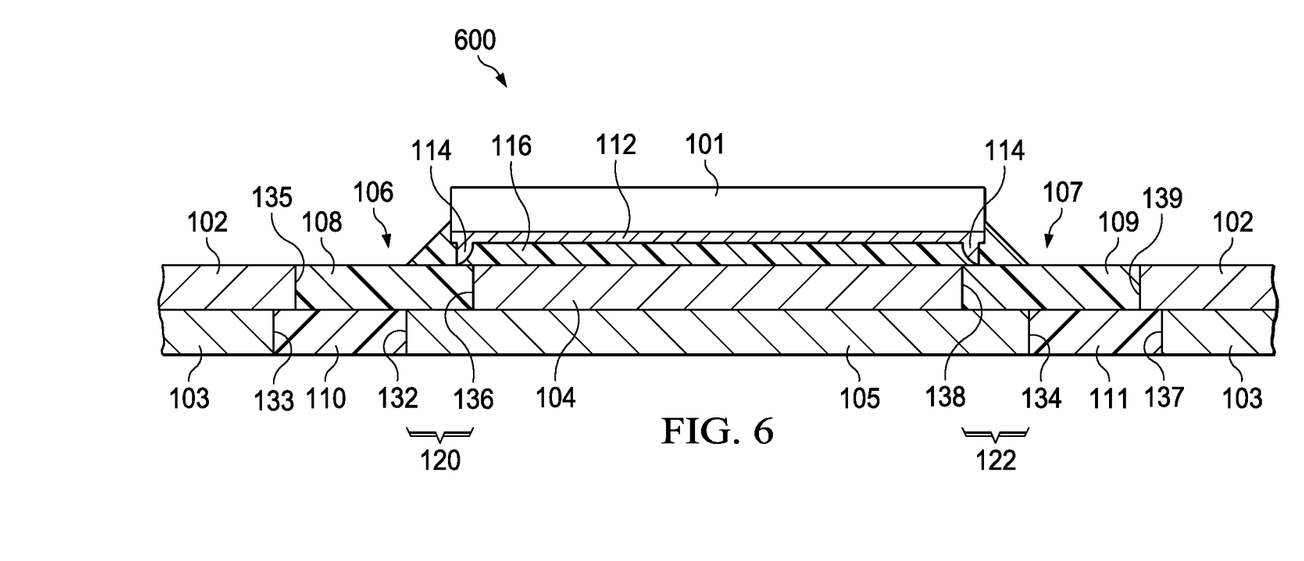
FIG. 6 depicts an example third phase of manufacturing an etched semiconductor device that provides lead frame isolation.

FIGS. 4-6 illustrate the processes of manufacturing a semiconductor device that achieves lead frame isolation thru etched pre-molding. The process illustrated in FIGS. 4-6 is employable to fabricate the semiconductor device 100 of FIG. 1 and/or the semiconductor device 300 of FIG. 3. For purposes of simplification of explanation, the same reference numbers are employed in FIGS. 1, 2, 4, 5, and 6 to denote the same structure.

FIG. 4 depicts the first phase 400 of manufacturing the semiconductor device, which involves manufacturing the lead frame 102. When manufacturing the lead frame 102, the length of a silicon die to be mounted on the lead frame 102 is a given parameter. The mounting pad 104 of the lead frame 102 is designed so that the length of the mounting pad 104 is smaller than the length of the silicon die.

A first etched area 106 is etched into the lead frame 102 on one side of the lead frame 102. The height/thickness of the first etched area 106 spans the height/thickness of the lead frame 102. Also, a second etched area 107 is etched on a side of the lead frame 102 opposite the first etched area 106. The height/thickness of the second etched area 107 spans the height/thickness of the lead frame 102. The first etched area 106 includes a first region 108 (e.g., first half) of the first etched area 106 and a second region 110 (e.g., second half) of the first etched area 106. In some examples, the second region 110 of the first etched area 106 has a similar length as the first region 108 of the first etched area 106. The second region 110 of the first etched area 106 is offset at a first distance 120 with respect to the first region 108 of the first etched area 106. Likewise, included in the second etched area 107 is a first region 109 of the second etched area 107 and a second region 111 of the second etched area 107. In some examples, the second region 111 of the second etched area 107 has a similar length as the first region 109 of the second etched area 107. The second region 111 of the second etched area 107 is offset at a second distance 122 with respect to the first region 109 of the second etched area 107. The first distance 120 and the second distance 122 are such that the support structure 105 of the second part 103 of the lead frame 102 that supports the mounting pad 104 is longer than the mounting pad 104 to provide more stability when the silicon die is mounted.

However, as discussed above with respect to FIGS. 1 and 2, the area of the support structure 105 depends on the thermal pad dimensions required or provided by the customer or user of the lead frame 102. Accordingly, in some examples, the second region 110 of the first etched area 106 is not offset from, and is flush with, the first region 108 of the first etched area 106 such that the first distance 120 is zero or substantially zero and the edge 132 is flush with the edge 136, or the second region 111 of the second etched area 107 is not offset from, and is flush with, the first region 109 of the second etched area 107 such that the second distance 122 is zero or substantially zero and the edge 134 is flush with the edge 138. While in other examples, the area of the support structure 105 is smaller than the area of the mounting pad 104 such that the edges 132, 134 of the support structure are underneath the mounting pad 104. Similar variations in lengths and positions are possible with respect to edges 133 and 135, and edges 137 and 139. The second part 103 of the lead frame 102 corresponds to and has a similar thickness as the second region 110 of the first etched area 106 and the second region 111 of the second etched area 107. In some examples, the second part 103 is part of the same original structure as the overall lead frame 102, in which case, the second part 103 is made of the same material as the rest of the lead frame 102 with second part 103 being etched more to give the second part 103 a stepped appearance as shown in FIGS. 1, 3, and 4. While in other examples, the second part 103 of the lead frame is made of a different material than the rest of the lead frame 102 or are separate pieces, in which case, the second part 103 is attached to the lead frame using an electrical or mechanical process, for example via epoxy weld, riveting, soldering or similar means.

FIG. 5 depicts the second phase 500 of manufacturing the semiconductor device, which involves inserting a non-conductive mold compound (e.g., a material such as plastic) into the first etched area 106 of the lead frame 102, and the same non-conductive mold compound material into the second etched area 107 of the lead frame 102. In other examples, different mold compound materials are used to fill the first etched area 106 and the second etched area 107, respectively. In some examples, the first region 108 of the first etched area 106 and the first region 109 of the second etched area 107 are filled with the mold compound. In other examples, the entire depth/thickness of the first etched area 106 and the second etched area 107 is filled with the mold compound. In such examples, the second region 110 of the first etched area 106 is filled with a mold compound, and the second region 111 of the second etched area 107 is filled with the mold compound. In some examples, the mold compound used to fill the second region 110 of the first etched area 106 is the same material as the mold compound used to fill the first region 108 of the first etched area 106, and the mold compound used to fill the second region 111 of the second etched area 107 is the same material as the mold compound used to fill the first region 109 of the second etched area 107. In other examples, the mold compound used to fill the second region 110 of the first etched area 106 is a different material from the mold compound used to fill the first region 108 of the first etched area 106, and the mold compound used to fill the second region 111 of the second etched area 107 is a different material from the mold compound used to fill the first region 109 of the second etched area 107. Also, in some examples, a different mold compound used to fill the first etched area 106 and the second etched area 107, respectively.

FIG. 6 depicts the third phase 600 of manufacturing the semiconductor device. During the third phase 600, a silicon die 101 having a metal material coating 112 is mounted onto the mounting pad 104 of the lead frame 102. The metal material coating 112 facilitates thermal performance of the silicon die 101. The silicon die 101 and metal material coating 112 is mounted, via an epoxy material 116, onto the lead frame 102. A volume of epoxy material 116 is dispensed onto the lead frame 102 to form a fillet weld on a side of the silicon die for adhesion of the silicon die 101 onto the lead frame 102. The epoxy material 116 also prevents the metal material coating 112 from coming into contact with the lead frame 102. Thus, the epoxy material 116 provides electrical isolation of the silicon die 101 from the lead frame 102. However, during wafer dicing a metal burr 114 is induced near opposite ends of the metal material coating 112. The metal burr 114 penetrates through the epoxy material 116 and, were it not for the etch (e.g., half etch) design of the lead frame 102, would come into contact with the lead frame 102 (and the mounting pad 104 of the lead frame 102), resulting in electrical leakage and shorting. Here, instead, the metal burr 114 comes into contact with the mold compound within the first etched area 106 and second etched area 107, rather than the lead frame 102 and the mounting pad 104 of the lead frame 102.

Figure 7:
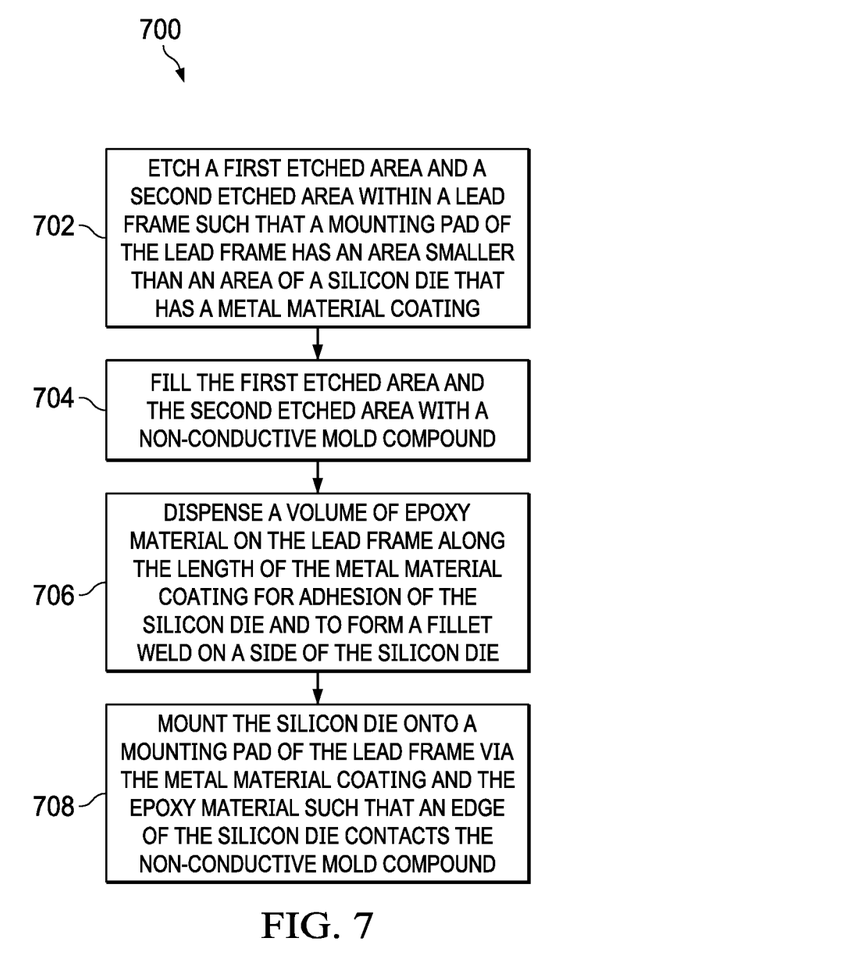
FIG. 7 illustrates an example method of manufacturing an etched semiconductor device that provides lead frame isolation.

FIG. 7 illustrates an example method 700 of manufacturing an etched (including half etched) semiconductor device that provides lead frame isolation. The method 700 is employable to fabricate the semiconductor device 100 of FIG. 1 and/or the semiconductor device 300 of FIG. 3. At 702, consistent with the design and description of FIG. 4, a first etched area and a second etched area is etched within a lead frame. The first etched area and second etched area are etched such that a mounting pad of a lead frame has a length smaller then a length of a silicon die that has a metal material coating. The metal material coating facilitates thermal performance of the silicon die. At 704, consistent with the design and description of FIG. 5, the first etched area and the second etched area are filled with a non-conductive mold compound. In some examples, the entire thickness of the first etched area and the second etched area is filled with the non-conductive mold compound (e.g., the lead frame design of FIG. 1), while in other examples, a region (e.g., one half) of the first etched area and the second etched area is filled with the non-conductive mold compound (e.g., the lead frame design of FIG. 3). The method 700, at 706 and 708, is consistent with the design and description of FIG. 6. At 706, a volume of epoxy material is dispensed onto the lead frame along a length of the metal material coating to form a fillet weld on a side of the silicon die. The epoxy material is dispensed so that the silicon die adheres to the lead frame, and also to prevent the metal material coating from coming into contact with the lead frame. At 708, the silicon die is mounted onto a mounting pad of the lead frame via the metal material coating and the epoxy material. A metal burr of the metal material coating, induced during wafer dicing, comes into contact with the first etched area and the second etched area filled with non-conductive mold compound rather than the lead frame, preventing electrical leakage and shorting.

What have been described above are examples of the disclosure. It is not possible to describe every conceivable combination of components or method for purposes of describing the disclosure, but many further combinations and permutations of the disclosure are possible. Accordingly, the disclosure is intended to embrace all such alterations, modifications, and variations that fall within the scope of this application, including the appended claims.

What is claimed is:

1. A semiconductor device, comprising: a silicon die having a metal material coating applied on one side; a lead frame, comprising: a mounting pad having an area smaller than an area of the silicon die, the silicon die being mounted on the lead frame via the mounting pad; and an etched area extending vertically from a first side of the lead frame to an opposing second side of the lead frame and at least partially filled with a non-conductive mold compound on a side of the lead frame that comes into direct contact with an end of the silicon die along an edge of the silicon die; and a volume of epoxy material dispensed onto the lead frame along a length of the metal material coating to form a fillet weld on a side of the silicon die configured to adhere the silicon die to the lead frame and to prevent the metal material coating from coming into direct contact with the lead frame.

2. The semiconductor device of claim 1, wherein the non-conductive mold compound comprises:
   a first mold material within a first region of the etched area; and
   a second mold material different from the first material within a second region of the etched area.

3. The semiconductor device of claim 1, wherein the first side and the second side are horizontal surfaces.

4. The semiconductor device of claim 3, wherein a first region of the etched area and a second region of the etched area span a thickness of the lead frame between the first surface and the second surface, the second region of the etched area is horizontally offset at a distance with respect to the first region of the etched area.

5. The semiconductor device of claim 1, wherein a second portion of the lead frame corresponds to and spans a thickness of a second region of the etched area.

6. The semiconductor device of claim 1, wherein the non-conductive mold compound comprises plastic material.

7. A semiconductor device, comprising:
   a silicon die having a metal material coating applied on one side;
   a lead frame, comprising:
      a mounting pad having an area smaller than an area of the silicon die, the silicon die being mounted on the lead frame via the mounting pad; and
      an etched area filled with a non-conductive mold compound on a side of the lead frame that comes into contact with an end of the silicon die along an edge of the silicon die, wherein a metal burr of the metal material coating situated at the same end of the lead frame as the etched area comes into contact with the non-conductive mold compound within the etched area to provide electrical isolation of the lead frame from the silicon die to prevent shorting; and
   a volume of epoxy material dispensed onto the lead frame along a length of the metal material coating to form a fillet weld on a side of the silicon die configured to adhere the silicon die to the lead frame and to prevent the metal material coating from coming into contact with the lead frame.

8. A semiconductor device, comprising:
   a silicon die having a metal material coating applied on one side;
   a lead frame, comprising:
      a mounting pad having an area smaller than an area of the silicon die, the silicon die being mounted on the lead frame via the mounting pad; and
      an etched area filled with a non-conductive mold compound on a side of the lead frame that comes into contact with an end of the silicon die along an edge of the silicon die;
      a second etched area filled with the non-conductive mold compound on a second side of the lead frame that comes into contact with a second end of the silicon die along a second edge of the silicon die, wherein a metal burr of the metal material coating situated at the same end of the lead frame as the second etched area comes into contact with the non-conductive mold compound within the second etched area to provide electrical isolation of the lead frame from the silicon die to prevent shorting; and
   a volume of epoxy material dispensed onto the lead frame along a length of the metal material coating to form a fillet weld on a side of the silicon die configured to adhere the silicon die to the lead frame and to prevent the metal material coating from coming into contact with the lead frame.

9. A semiconductor device, comprising: a silicon die having a metal material coating applied on one side; and a lead frame, comprising: a mounting pad having an area smaller than an area of the silicon die, the silicon die being mounted on the lead frame via the mounting pad; and an etched area extending from a first horizontal side of the lead frame to an opposing second horizontal side of the lead frame and at least partially filled with a non-conductive mold compound on a side of the lead frame that comes into direct contact with an end of the silicon die along an edge of the silicon die.

10. The semiconductor device of claim 9, wherein the mounting pad has an area for mounting the silicon die that is smaller than a mounting surface of the silicon die.

11. A semiconductor device, comprising:
   a silicon die having a metal material coating applied on one side; and
   a lead frame, comprising:
      a mounting pad having an area smaller than an area of the silicon die, the silicon die being mounted on the lead frame via the mounting pad; and
      an etched area filled with a non-conductive mold compound on a side of the lead frame that comes into contact with an end of the silicon die along an edge of the silicon die, wherein a metal burr of the metal material coating situated at the same end of the lead frame as the etched area comes into contact with the non-conductive mold compound within the etched area to provide electrical isolation of the lead frame from the silicon die to prevent shorting.

12. A method of making a semiconductor device, comprising: applying a metal material coating on one side of a silicon die; forming a lead frame mounting pad having an area smaller than an area of the silicon die; and etching an area extending from a first side of the lead frame to a vertically opposing second side of the lead frame and completely filling the etched area with a non-conductive mold compound on a side of the lead frame that comes into direct contact with an end of the silicon die along an edge of the silicon die; dispensing a volume of epoxy material onto the lead frame along a length of the metal material coating to form a fillet weld on a side of the silicon die configured to adhere the silicon die to the lead frame; and attaching the metal material coating side of the silicon die to the lead frame mounting pad.

13. The method of claim 12, wherein the metal material completely covers the one side of the silicon die.

14. The method of claim 12, wherein a first region of the etched area and a second region of the etched area span a thickness of the lead frame between the first side of the lead frame and the second side of the lead frame, the second region of the etched area is horizontally offset at a distance with respect to the first region of the etched area.

15. The method claim of claim 12, wherein a second portion of the lead frame corresponds to and spans a thickness of a second region of the etched area.

16. The method of claim 12, wherein the non-conductive mold compound comprises plastic material.

17. A method of making a semiconductor device, comprising:
   providing a silicon die having a metal material coating applied on one side; and
   providing a lead frame, comprising:
      a mounting pad having an area smaller than an area of the silicon die, the silicon die being mounted on the lead frame via the mounting pad; and
      an etched area filled with a non-conductive mold compound on a side of the lead frame that comes into contact with an end of the silicon die along an edge of the silicon die, wherein a metal burr of the metal material coating situated at the same end of the lead frame as the etched area comes into contact with the non-conductive mold compound within the etched area to provide electrical isolation of the lead frame from the silicon die to prevent shorting.

18. A method of making a semiconductor device, comprising:
   applying a metal material coating on one side of a silicon die;
   forming a lead frame mounting pad having an area smaller than an area of the silicon die; and
   etching an area extending from a first side of the lead frame to an opposing second side of the lead frame and at least partially filled with a non-conductive mold compound on a side of the lead frame that comes into contact with an end of the silicon die along an edge of the silicon die, wherein a first region of the etched area is filled with the non-conductive mold compound, and a second region of the etched area comprises a void;
   dispensing a volume of epoxy material onto the lead frame along a length of the metal material coating to form a fillet weld on a side of the silicon die configured to adhere the silicon die to the lead frame; and
   mounting the silicon die on the lead frame mounting pad.

19. A method of making a semiconductor device, comprising:
   providing a silicon die having a metal material coating applied on one side; and
   providing a lead frame, comprising:
      a mounting pad having an area smaller than an area of the silicon die, the silicon die being mounted on the lead frame via the mounting pad;
      an etched area filled with a non-conductive mold compound on a side of the lead frame that comes into contact with an end of the silicon die along an edge of the silicon die;
      a second etched area filled with the non-conductive mold compound on a second side of the lead frame that comes into contact with a second end of the silicon die along a second edge of the silicon die, wherein a metal burr of the metal material coating situated at the same end of the lead frame as the second etched area comes into contact with the non-conductive mold compound within the second etched area to provide electrical isolation of the lead frame from the silicon die to prevent shorting.

20. A method of making a semiconductor device, comprising:
   providing a silicon die having a metal material coating applied on one side;
   providing a lead frame, comprising:
      a mounting pad having an area smaller than an area of the silicon die; and
      an etched area extending from a top side of the lead frame to an opposing bottom side of the lead frame and filled with two different types of non-conductive mold compound on a side of the lead frame that comes into contact with an end of the silicon die along an edge of the silicon die; and
   attaching the metal material coating side of the silicon die to the leadframe using an adhesive, at least a portion of the silicon die extending over the etched area.

21. The method of claim 20, wherein the mounting pad has an area for mounting the silicon die that is smaller than a mounting surface of the silicon die.

22. A method of making a semiconductor device, comprising:
   providing a silicon die having a metal material coating applied on one side; and
   providing a lead frame, comprising:
      a mounting pad having an area smaller than an area of the silicon die, the silicon die being mounted on the lead frame via the mounting pad; and
      an etched area filled with a non-conductive mold compound on a side of the lead frame that comes into contact with an end of the silicon die along an edge of the silicon die, wherein a metal burr of the metal material coating situated at the same end of the lead frame as the etched area comes into contact with the non-conductive mold compound within the etched area to provide electrical isolation of the lead frame from the silicon die to prevent shorting.

23. A method of making a semiconductor device, comprising:
   providing a silicon die having a metal material coating applied on one side; and
   providing a lead frame, comprising:
      a mounting pad having an area smaller than an area of the silicon die, the silicon die being mounted on the lead frame via the mounting pad; and
      an etched area filled with a non-conductive mold compound on a side of the lead frame that comes into contact with an end of the silicon die along an edge of the silicon die, wherein a metal burr of the metal material coating situated at the same end of the lead frame as the etched area comes into contact with the non-conductive mold compound within the etched area to provide electrical isolation of the lead frame from the silicon die to prevent shorting, and wherein a first region of the etched area is filled with the non-conductive mold compound, and a second region of the etched area comprises a void.

24. A method of making a semiconductor device, comprising:
applying a metal material coating on one side of a silicon die;
forming a lead frame, comprising:
providing a mounting pad having an area smaller than an area of the silicon die, mounting the silicon die on the lead frame via the mounting pad; and
filling an etched area extending from a top side of the lead frame to an opposing bottom side of the lead frame with a non-conductive mold compound; and
attaching the metal material coating of the silicon die to the lead frame.

25. The method of claim 24, wherein the non-conductive mold compound comprises:
a first mold material within a first region of the etched area; and
a second mold material different from the first material within a second region of the etched area.

26. The method of claim 24, wherein the top side and the bottom side are horizontal surfaces.

27. The method of claim 26, wherein a first region of the etched area and a second region of the etched area span a thickness of the lead frame between the top surface and the bottom surface, the second region of the etched area is horizontally offset at a distance with respect to the first region of the etched area.

28. The method of claim 24, wherein a second portion of the lead frame corresponds to and spans a thickness of a second region of the etched area.

29. The method of claim 24, wherein the non-conductive mold compound comprises plastic material.

30. A method of making a semiconductor device, comprising:
applying a metal material coating on one side of a silicon die;
forming a lead frame, comprising:
providing a mounting pad having an area smaller than an area of the silicon die, mounting the silicon die on the lead frame via the mounting pad; and
filling an etched area with a non-conductive mold compound on a side of the lead frame that comes into contact with an end of the silicon die along an edge of the silicon die, wherein a metal burr of the metal material coating situated at the same end of the lead frame as the etched area comes into contact with the non-conductive mold compound within the etched area to provide electrical isolation of the lead frame from the silicon die to prevent shorting.

31. A method of making a semiconductor device, comprising:
applying a metal material coating on one side of a silicon die;
forming a lead frame, comprising:
providing a mounting pad having an area smaller than an area of the silicon die, mounting the silicon die on the lead frame via the mounting pad;

filling an etched area with a non-conductive mold compound on a side of the lead frame that comes into contact with an end of the silicon die along an edge of the silicon die; and
a second etched area filled with the non-conductive mold compound on a second side of the lead frame that comes into contact with a second end of the silicon die along a second edge of the silicon die, wherein a metal burr of the metal material coating situated at the same end of the lead frame as the second etched area comes into contact with the non-conductive mold compound within the second etched area to provide electrical isolation of the lead frame from the silicon die to prevent shorting.

32. A method of making a semiconductor device, comprising:
applying a metal material coating on one side of a silicon die; and
forming a lead frame, comprising:
providing a mounting pad having an area smaller than an area of the silicon die, mounting the silicon die on the lead frame via the mounting pad; and
filling an etched area extending from a top side of the lead frame to an opposing bottom side of the lead frame with two different types of a non-conductive mold compound.

33. The method of claim 32, wherein the mounting pad has an area for mounting the silicon die that is smaller than a mounting surface of the silicon die.

34. A method of making a semiconductor device, comprising:
applying a metal material coating on one side of a silicon die; and
forming a lead frame, comprising:
providing a mounting pad having an area smaller than an area of the silicon die, mounting the silicon die on the lead frame via the mounting pad; and
filling an etched area with a non-conductive mold compound on a side of the lead frame that comes into contact with an end of the silicon die along an edge of the silicon die, wherein a metal burr of the metal material coating situated at the same end of the lead frame as the etched area comes into contact with the non-conductive mold compound within the etched area to provide electrical isolation of the lead frame from the silicon die to prevent shorting.

35. A semiconductor device, comprising:
a silicon die having a metal material coating applied on one side;
a lead frame, comprising:
a mounting pad having an area smaller than an area of the silicon die, the silicon die being mounted on the lead frame via the mounting pad; and
an etched area filled with at least two different non-conductive mold compounds on a side of the lead frame that comes into contact with an end of the silicon die along an edge of the silicon die, wherein a first region of the etched area is filled with a first of the at least two non-conductive mold compounds, and a second region of the etched area is filled with a second of the at least two non-conductive mold compounds.

36. A semiconductor device, comprising:
a silicon die having a metal material coating applied on one side; and
a lead frame, comprising:
- a mounting pad having an area smaller than an area of the silicon die, the silicon die being mounted on the lead frame via the mounting pad; and
- an etched area filled with a non-conductive mold compound on a side of the lead frame that comes into contact with an end of the silicon die along an edge of the silicon die, wherein a first region of the etched area is filled with the non-conductive mold compound, and a second region of the etched area comprises a void.

37. A method of making a semiconductor device, comprising:
applying a metal material coating on one side of a silicon die;
forming a lead frame mounting pad having an area smaller than an area of the silicon die; and
etching an area extending from a first side of the lead frame to an opposing second side of the lead frame and at least partially filling the etched area with a non-conductive mold compound on a side of the lead frame that comes into contact with an end of the silicon die along an edge of the silicon die, wherein a first region of the etched area is filled with the non-conductive mold compound, and a second region of the etched area comprises a void;
dispensing a volume of epoxy material onto the lead frame along a length of the metal material coating to form a fillet weld on a side of the silicon die configured to adhere the silicon die to the lead frame; and
attaching the metal material coating side of the silicon die to the lead frame mounting pad.

38. A method of making a semiconductor device, comprising:
applying a metal material coating on one side of a silicon die; and
forming a lead frame, comprising:
- providing a mounting pad having an area smaller than an area of the silicon die, mounting the silicon die on the lead frame via the mounting pad; and
- filling an etched area with a non-conductive mold compound on a side of the lead frame that comes into contact with an end of the silicon die along an edge of the silicon die, wherein a first region of the etched area is filled with the non-conductive mold compound, and a second region of the etched area comprises a void.

* * * * *